US012593530B2

(12) United States Patent
Kalio et al.

(10) Patent No.: US 12,593,530 B2
(45) Date of Patent: Mar. 31, 2026

(54) THIN-FILM PHOTOVOLTAIC MODULE WITH SILVER SULFIDE COATING AND PREPARATION METHOD THEREOF

(71) Applicants: CNBM RESEARCH INSTITUTE FOR ADVANCED GLASS MATERIALS GROUP CO., LTD., Bengbu (CN); TRIUMPH SCIENCE & TECHNOLOGY GROUP CO., LTD., Beijing (CN)

(72) Inventors: Rene Kalio, Leipzig (DE); Michael Koerbl, Dresden (DE)

(73) Assignees: CNBM RESEARCH INSTITUTE FOR ADVANCED GLASS MATERIALS GROUP CO., LTD., Anhui (CN); TRIUMPH SCIENCE & TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 18/735,164

(22) Filed: Jun. 5, 2024

(65) Prior Publication Data

US 2024/0322055 A1     Sep. 26, 2024

Related U.S. Application Data

(63) Continuation of application No. PCT/CN2023/077328, filed on Feb. 21, 2023.

(51) Int. Cl.
  *H10F 77/30*        (2025.01)
  *H10F 19/31*        (2025.01)
  *H10F 71/00*        (2025.01)

(52) U.S. Cl.
  CPC ........... *H10F 77/311* (2025.01); *H10F 19/31* (2025.01); *H10F 71/1375* (2025.01)

(58) Field of Classification Search
  None
  See application file for complete search history.

(56)         References Cited

U.S. PATENT DOCUMENTS 7,122,398 B1 * 10/2006 Pichler .................. H10F 71/137
                                          257/E27.125
2010/0243048 A1 * 9/2010 Laudisio ................... C03C 8/02
                                          252/514

(Continued)

FOREIGN PATENT DOCUMENTS

CN         1349665 A       5/2002
CN       101246914 A       8/2008

(Continued)

*Primary Examiner* — Eli S Mekhlin

(57)         ABSTRACT

The present invention relates to a thin-film photovoltaic module with a silver sulfide coating, including a glass substrate. A back-contact layer, an absorber layer and a front electrode layer are sequentially stacked on the glass substrate. The top surface of the front electrode layer is coated with a metal grid matching the front electrode layer, the metal grid is made of silver-containing paste, and the surface of the metal grid is covered by a black silver sulfide coating. According to the present invention, by forming the black silver sulfide coating on the surface of the metal grid, the optical reflection of the metal grid is reduced, so that the reflectivity of the metal grid is decreased, and as a result, the brightness of photovoltaic circuits and modules with the metal grid is decreased, improving the appearance.

11 Claims, 7 Drawing Sheets

(56)     References Cited

U.S. PATENT DOCUMENTS

| | | |
|---|---|---|
| 2012/0174957 A1 | 7/2012 | Nishimura |
| 2014/0001509 A1 | 1/2014 | Lin |
| 2016/0049542 A1 | 2/2016 | Agrawal et al. |
| 2025/0142980 A1* | 5/2025 | Barth .................... H10F 19/804 |

FOREIGN PATENT DOCUMENTS

| | | |
|---|---|---|
| CN | 102709348 A | 10/2012 |
| CN | 113948597 A | 1/2022 |
| CN | 114600202 A | 6/2022 |
| JP | H06204524 A | 7/1994 |
| JP | 2013051112 A | 3/2013 |
| JP | 2014078583 A | 5/2014 |
| KR | 20220149453 A | 11/2022 |
| WO | 2011040461 A1 | 4/2011 |
| WO | 2023017007 A1 | 2/2023 |

* cited by examiner

THIN-FILM PHOTOVOLTAIC MODULE WITH SILVER SULFIDE COATING AND PREPARATION METHOD THEREOF

CROSS-REFERENCE TO RELATED APPLICATIONS

This application is a continuation of International Patent Application No. PCT/CN2023/077328, filed on Feb. 21, 2023. The content of the aforementioned application, including any intervening amendments made thereto, is incorporated herein by reference in its entirety.

TECHNICAL FIELD

The present invention belongs to the field of solar cell technology, and in particular, to a thin-film photovoltaic module with a silver sulfide coating and a preparation method thereof.

BACKGROUND

In order to improve the performance of CIGS (copper indium gallium diselenide) photovoltaic modules, in recent years, Avancis has developed a technique to increase conductivity by the application of grid lines on the photovoltaic circuit. The grid lines serve to supplement the moderate conductivity of the top layer of the absorber stack of the circuit, which consists of aluminium-doped zinc oxide (AZO) or other transparent conductive oxides (TCOs), with a proportion of metallic conductivity. Due to its high metallic conductivity, the grid acts like a multitude of busbars, that offer the charge carriers a less obstructed path to flow along the light-facing side of the circuit. As a result, the series resistance of the photovoltaic module will decrease.

The conduction-promoting effect of the grid is counteracted by the fact that a metal-covered field is opaque, so the region covered by it is photovoltaically inactive, and the total dead zone area on the circuit is increased. Because the proportion of the area covered by the grid is enlarged, the total area of a dead zone on the circuit is increased. Because the grid consists of a highly reflective silver paint which is applied in the form of nano-particles using a printing process, light striking the grid is largely not absorbed but reflected. To the observer of a PV circuit or PV module equipped with a silver grid, this becomes visible by a higher brightness (higher L-value) of grid circuits and grid modules compared to CIGS PV circuits and modules without grids.

PV modules of the SKALA type from Avancis GmbH, which are often used in building-integrated photovoltaics (BIPV), make use of the high absorption (the low L* value) of the CIGS circuit which acts as a deep black background for a front glass which has been equipped with a very specific visible reflection spectrum by magnetron-sputtering. The combination of a circuit background and a colored front glass composes a PV module of well-defined colour with specific color values L*, a* and b*, or L, C and h respectively. Some of the PV module colours that are produced this way, especially those with relatively low L* values, cannot be produced with grid circuits due to their too high reflectivity. This applies to a large extent to the colours black and anthracite, which are not producible with grid circuits at all, and to a lesser extent to colours such as dark grey, grey and bronze, and measurable and/or visible shifts in brightness will occur in these colors.

SUMMARY

Aiming at the deficiencies of a prior art, the present invention provides a CIGS thin-film photovoltaic module with a silver sulfide coating and a preparation method thereof. The specific technical solution is as follows:

A thin-film photovoltaic module with a silver sulfide coating includes a glass substrate. A back-contact layer, an absorber layer and a front electrode layer are sequentially stacked on the glass substrate. The top surface of the front electrode layer is coated with a metal grid matching the front electrode layer, the metal grid is made of silver-containing paste, and the surface of the metal grid is covered by a black silver sulfide coating.

Further, the metal grid consists of at least 10% or 40% of silver.

Further, any of screen printing, ink-jet printing and parallel extrusion dispersion is adopted as a method for applying the metal grid.

A preparation method for the CIGS thin-film photovoltaic module with the silver sulfide coating includes the following steps:

Step S1: creating a planar thin-film photovoltaic circuit;

Step S2: forming a metal grid by coating;

Step S3: curing or sintering the metal grid;

Step S4: making the metal grid contacting or exposed to a sulfur-containing substance capable of generating sulfide ions, so that reaction takes place on the surface of the metal grid to form a black silver sulfide coating;

Step S5: removing residues of the sulfur-containing substance outside the silver sulfide coating connected with the top layer of the metal grid, and performing washing and drying.

Further, the form of the sulfide may be any of soluble sulfide, gaseous hydrogen sulfide and organic sulfide.

Further, the soluble sulfide is a hygroscopic alkali metal sulfide.

Further, the hygroscopic alkali metal sulfide is a powdery sodium sulfide.

Further, the powdery sodium sulfide may be applied to the metal grid in a manner that a concentrated aqueous sodium sulfide solution is formed by moisture content in the air and the hygroscopic behavior of sodium sulfide within at least one hour, and the aqueous solution reacts with silver on the surface of the metal grid to form a silver sulfide coating.

Further, the powdery sodium sulfide may be applied to the metal grid in another manner that an aqueous sodium sulfide solution is pre-prepared, and the aqueous solution carries out contact reaction with the metal grid by any of spraying, immersion, raking and impregnation to form a silver sulfide coating.

Further, the aforementioned aqueous sodium sulfide solution may also be applied to the surface of the metal grid by heating, vacuum evaporation and vacuum deposition. Further, in all cases where the hygroscopic alkali metal sulfide is used, a sulfuration step is followed by one or more washing steps, and moisture traces in the treated metal grid circuit are removed by a drying step of removing covering agent and some involved water.

Further, when the gaseous hydrogen sulfide is used, the metal grid is placed in an airtight chamber filled with the gaseous hydrogen sulfide, and the concentration and injection duration of the gaseous hydrogen sulfide depend on the reaction speed of silver sulfide on the surface of the metal grid and the thickness or color of a desired silver sulfide coating.

Further, the reaction between the silver on the surface of the metal grid and the organic sulfide may vary due to aggregation states, that is, the organic sulfide in gas phase or liquid phase reacts with the silver on the surface of the metal grid by gas phase release or liquid phase wetting to form the silver sulfide coating.

Beneficial effects of the present invention are as follows:

According to the present invention, by forming the black silver sulfide coating on the surface of the metal grid, the optical reflection of the metal grid is reduced, so that the reflectivity of the metal grid is decreased, and as a result, the brightness of photovoltaic circuits and modules with the metal grid is decreased, improving the appearance.

BRIEF DESCRIPTION OF DRAWINGS

FIG. 1-2 shows a schematic structure diagram of a solar cell of the present invention;

FIG. 2 shows a demonstrative diagram of concentrated $Na_2S$ solution, prepared from hygroscopic $Na_2S$ powder under the influence of atmospheric humidity, on the surface of a circuit with grid lines (horizontal) and element structures (vertical) in the present invention;

Figure 1:
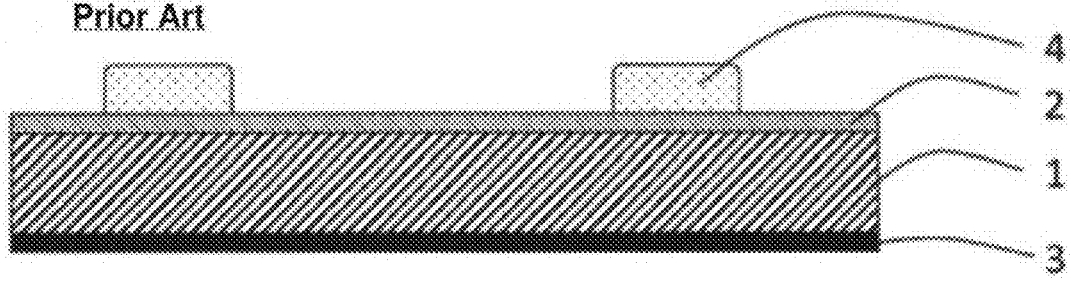
FIG. 1-1 shows a schematic general standard structure diagram of an existing solar cell.

In the drawings: 1. Absorber layer; 2. Front electrode layer; 3. Back contact layer; 4. Metal grid; 5. Silver sulfide coating.

DESCRIPTION OF EMBODIMENTS

In order to make the objective, technical solution and advantages of the present invention clearer, the present invention will be further explained in detail hereinafter with reference embodiments. It should be understood that the specific embodiments described herein are only intended to explain the present invention rather than to limit the present invention.

The technical solution in the embodiments of the present application is intended to solve the technical problem of high reflectivity of metal grids in thin-film photovoltaic modules. The overall idea is as follows:

So far, it has long been considered ineffective to add an additional grid on a front electrode layer made of TCO in a CIGS thin-film photovoltaic module for dissipating charges from an illuminated side of a CIGS thin-film photovoltaic cell, especially because screen printing is the conventional printing technology in crystalline silicon PV. In comparison, CIGS-thin-layer-PV requires an oversized printing screen, so a large amount of silver printing paste is needed. The silver printing paste is exposed to the environment in the process of printing, leading to early degradation. Since a small printing width is required, the transfer of silver paste through the printing screen gradually approaches its limit.

Therefore, all the publications about the subjects of metal grids and CIGS photovoltaics which have been published so far focus on this point.

By minimizing the shading loss and light absorption loss of a metal grid on a front electrode layer whilst and optimizing current flowing through the TCO and the grid, in a way that a CIGS cell equipped with the grid can provide a better overall performance than a CIGS cell without a grid, i.e. achieve higher efficiency. Key properties of such a grid are a high aspect ratio of the grid lines and a reduced TCO layer thickness, optimizing the efficiency of light transmission.

In contrast, in crystalline silicon photovoltaic cells, the front metal contacts are gradually replaced by back contacts. In order to achieve a "fully black module" with a "classic cell structure" in crystalline silicon photovoltaics, besides the structure and coating of the actual solar cell, a busbar with a black coating on the outside is used to absorb light to the max. Due to a relatively high aspect ratio, their visibility is low, so there is no need to blacken narrower grid lines.

In CIGS photovoltaics, so far, the requirements for visual uniformity and low circuit reflectivity have been relatively easy to meet. CIGS circuits produced by a method commonly used at present (i.e. without a grid) are well-suited for the construction of colored solar modules, because the color carrier (e.g. an interference color layer on the front glass) requires the background to be as dark and uniform as possible and color shift to be as small as possible. Although increasing efficiency, the combination of CIGS-PV and a metal grid has made the good applicability of a CIGS circuit to a colored solar module invalid to a certain degree: since the brightness of a grid-bearing circuit is too high (L* value is too high), it is difficult to create dark module colors, and the grid pattern becomes visible through colored glass, leading to a change in the visual appearance and a brighter hue of the overall module color. Due to the novelty of the problem, there is no mature, market-oriented solution to this problem at present. An essential method for decreasing the silvery gloss of grid lines is to increase the aspect ratio, so as to reduce the visible area of highly reflective metal. However, while reducing the line width of a grid, the solution described here also darkens the grid lines in general.

The method described here relates to a device for generating electrical energy from light by means of the internal photovoltaic effect, where a semiconductor, e.g. copper indium gallium di(sulfoselenide) (CIGS or CIGSSe) or doped silicon, serves as an absorber layer for converting light energy into electrical energy, and where the transport of electric charges on the side facing the light does not exclusively take place via a full-surface layer of a thin, transparent conductive layer (e.g. a transparent conductive oxide (TCO) in the case of CIGS solar cells), but the conduction of the charge carriers is supported by metallic conductor paths ("grid") applied to the TCO.

In order to better understand the aforementioned technical solution, the aforementioned technical solution will be explained in detail below with reference to the accompanying drawings of the specification and specific embodiments.

Figures 1, 2:
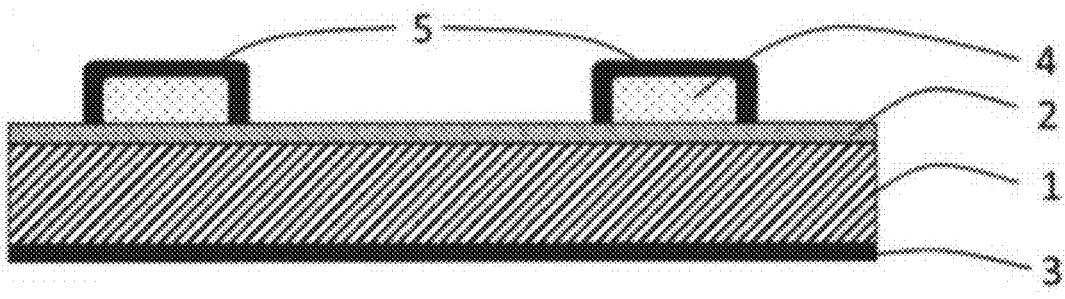
Figure 2:

As shown in FIG. 1-1 and FIG. 1-2, a thin-film photovoltaic module with a silver sulfide coating 5 includes a glass substrate. A back-contact layer 3, an absorber layer 1 and a front electrode layer 2 are sequentially stacked on the glass substrate. The top surface of the front electrode layer is coated with a metal grid 4 matching the front electrode layer, the metal grid is made of silver-containing paste, and the surface of the metal grid 4 is covered by a black silver sulfide coating 5.

By adopting the aforementioned technical solution, according to the thin-film photovoltaic module, by forming the black silver sulfide coating on the surface of the metal grid, the optical reflection of the metal grid is reduced, so that the reflectivity of the metal grid is decreased, and as a result, the brightness of photovoltaic circuits and modules with the metal grid is decreased, improving the appearance.

Preferably, the metal grid 4 consists of at least 10% or 40% of silver.

By adopting the aforementioned technical solution, in the case of a silicon solar cell with a front electrode (emitter layer) facing the light, the conduction of charge carriers will be enhanced through metal conductor tracks ("grid") which are applied on the front electrode layer and preferably consist of at least 10% to 40% of silver.

Preferably, any of screen printing, ink-jet printing and parallel extrusion dispersion is adopted as a method for applying the metal grid.

By adopting the aforementioned technical solution, a printing technique, other than screen printing, is used, e.g. ink-jet printing (Avancis) or "parallel (extrusion) dispersion". Among others, this should also minimize the region covered by the covering grid and maximize conductivity with a highest possible aspect ratio.

A preparation method for the thin-film photovoltaic module with the silver sulfide coating 5 includes the following steps:

Step S1: creating a planar thin-film photovoltaic circuit;

Step S2: forming a metal grid 4 by coating;

Step S3: curing or sintering the metal grid 4;

Step S4: making the metal grid 4 contacting or exposed to a sulfide capable of forming sulfide ions, so that reaction takes place on the surface of the metal grid to form a black silver sulfide coating 5;

Step S5: removing residues outside the silver sulfide coating 5 connected with the top layer of the metal grid 4, and performing washing and drying.

By adopting the aforementioned technical solution, the thin-film photovoltaic module is darkened by the method described in the present invention, so that the whole thin-film photovoltaic module is very dark optically, so a more uniform solar cell or photovoltaic circuit surface is obtained. In a broader sense, the present invention relates to any type of solar cell with a silver-based metal grid, i.e. also crystalline silicon solar cells equipped with a metal grid on top of the light incidence side, i.e. on top of the emitter layer of the crystalline silicon solar cell. The highly reflective metallic silver surface of the grid will be selectively covered with a dark layer to decrease reflectivity, without significantly affecting the optical or electrical properties of other components of the solar cell.

The method of the present invention is based on the formation of black silver sulfide, whenever silver metal is brought in contact with sulfide ions or other forms of reactive sulfur compounds which are able to at least intermediately form sulfide ions. Such formation of silver sulfide also occurs in the metal grid at a layer close to the surface, when it comes into contact with reactive sulfur compounds in an appropriate form, thus forming a black silver sulfide coating on the metal grid.

The reactive sulfur which reacts with elements to generate silver (II) sulfide follows the following molecular formula:

$$Ag+S \rightarrow AgS$$

In addition, the following equation applies to the reaction between elemental silver and sulfide ions:

$$Ag+S^{2-} \rightarrow AgS+2e-$$

Preferably, the form of the sulfide may be any of soluble sulfide, gaseous hydrogen sulfide and organic sulfide.

In addition to being present in the form of elemental sulfur ("sulfur bloom"), sulfur may be supplied into the reaction primarily in the form of soluble sulfides, e.g. alkali sulfides such as sodium sulfide, as gaseous or dissolved hydrogen sulfide, or in the form of sulfur-containing organic substances ("organo-sulfides"), which are capable of releasing sulfur as sulfide into the grid metal. By adopting the aforementioned technical solution, sulfur can be transferred in various dosage forms into the metal grid for reaction.

If elemental sulfur is to be used to carry out the reaction, deposition of the sulfur from the gas phase is preferable in order to achieve the most uniform coverage of the circuit surface. Deposition of elemental sulfur from a solution in carbon disulfide would also be possible, but is not recommended for reasons of occupational safety and environmental protection. Control of the reaction process and thus of the color density and depth of the sulfidation process of the silver in the grid can be achieved by setting a defined storage period in the presence of the sulfur-containing agent. Depending on the type of sulfur-containing reagent, a heat treatment is necessary after its application to the circuit, the temperature control of which can also be used to control the reaction process.

After removal of the sulfur-containing agent, a further reaction is not to be expected due to the stability of the formed silver sulfide, neither are side reactions to be expected, since the structure of the CIGS is on the one hand already saturated with the chalcogenides sulfide and selenide, and on the other hand, the layer package is sufficiently protected for the time of exposure to the sulfur-containing foreign substances by the outer layers of AZO and possibly other migration-inhibiting layers, so that the sulfide ions selectively react with the surface of the silver grid. Attack of the sulfur in the depth of the grid lines is not to be feared, since the grid applied to the circuit as a nanoparticle suspension is annealed after application for the purpose of sintering, which largely eliminates the porosity of the grid silver.

The process of sulfurizing a silver ground line described here may also be used to darken the grid lines on the crystalline silicon photovoltaic cell as long as the substances used and produced do not damage the crystalline silicon cell.

Preferably, the soluble sulfide is a hygroscopic alkali metal sulfide; and the hygroscopic alkali metal sulfide is powdery sodium sulfide.

Preferably, the powdery sodium sulfide may be applied to the metal grid 4 in a manner that a concentrated aqueous sodium sulfide solution is formed by moisture content in the air and the hygroscopic behavior of the sodium sulfide within at least one hour, and the aqueous solution reacts with silver on the surface of the metal grid 4 to form a silver sulfide coating 5.

By adopting the aforementioned technical solution, one way to apply the soluble sulfide is to use the form of an aqueous solution. It may be the simplest way that a silver grid is formed by using the powdery sodium sulfide (as an inexpensive water-soluble and hygroscopic sulfide) and finely distribute it on the circuit. A concentrated solution in water is formed by moisture content in the air and the hygroscopic behavior of the sodium sulfide within a few hours. The solution of the sodium sulfide in water reacts with the silver surface of the metal grid to affect its reflectivity.

Preferably, the powdery sodium sulfide may be applied to the metal grid 4 in another manner that an aqueous sodium sulfide solution is pre-prepared, and the aqueous solution carries out contact reaction with the metal grid 4 by any of spraying, immersion, raking and impregnation to form a silver sulfide coating 5.

By adopting the aforementioned technical solution, the soluble sulfide may be applied in another manner that an aqueous sodium sulfide solution is pre-prepared. The solution is to allow the aqueous sodium sulfide solution to contact with the circuit and act on the silver surface of the grid lines within a specified period of time, for example by spraying, immersion, raking, impregnation or other methods.

Preferably, the aforementioned aqueous sodium sulfide solution may also be applied on the surface of the metal grid by heating, vacuum evaporation and vacuum deposition.

By adopting the aforementioned technical solution, due to the known sensitivity of circuit materials to water and moisture, these methods are superior to the aforementioned method using the aqueous component. Thanks to this process, the circuit will not come into contact with a large amount of water or aqueous solution.

Preferably, in all cases where the hygroscopic alkali metal sulfide is used, a sulfuration step should be followed by one or more washing steps, and moisture traces on the treated metal grid 4 circuit are removed according to a drying step of removing covering agent and some involved water.

By adopting the aforementioned technical solution, in all cases where the metal grid circuit is in contact with alkali metal-containing substances, it is advisable that the absorber stack over the CIGS is equipped with a low-porosity sodium diffusion barrier layer (AZO, SiNxOy) to prevent uncontrolled diffusion of alkali ions into the absorber. In all cases where alkali sulfide is used, sulfidation must be followed by one or more washing steps to remove the excess reagent, and a number of drying steps to remove water and traces of moisture from the treated circuit.

Further, sulfides or other sulfur-containing chemicals that are soluble in non-aqueous solvents, water-free solutions may be used to treat the metal grid on the circuit. By using water-free solvents, the potentially degrading influence of water towards the circuit materials can be avoided.

Preferably, when the gaseous hydrogen sulfide is used, the metal grid 4 is placed in an airtight chamber filled with the gaseous hydrogen sulfide, and the concentration and injection duration of the gaseous hydrogen sulfide depend on the reaction speed of silver sulfide on the surface of the metal grid 4 and the thickness or color of a desired silver sulfide coating 5.

By adopting the aforementioned technical solution, some boundary conditions of the aforementioned reaction, such as other gases (e.g. oxygen) which exist in the reaction and may be prevented, can react with hydrogen sulfide under certain conditions, and an acidic reaction product may hinder the formation of a dark silver sulfide layer, and the optimal temperature and humidity of the gas mixture will be determined by a specific test series.

Preferably, the reaction between the silver on the surface of the metal grid 4 and the organic sulfide may vary due to aggregation states, that is, the organic sulfide in gas phase or liquid phase reacts with the silver on the surface of the metal grid 4 to form the silver sulfide coating 5.

By adopting the aforementioned technical solution, the application of a gaseous or volatile organic sulfur compound via the gas phase is similar to the aforementioned treatment of the grid surface with gaseous hydrogen sulfide, and the liquid-phase treatment of the grid surface with dissolved gaseous or volatile organic sulfur compound is similar to wetting by a solution of a soluble solid or liquid sulfide, such as sodium sulfide.

Figure 3:
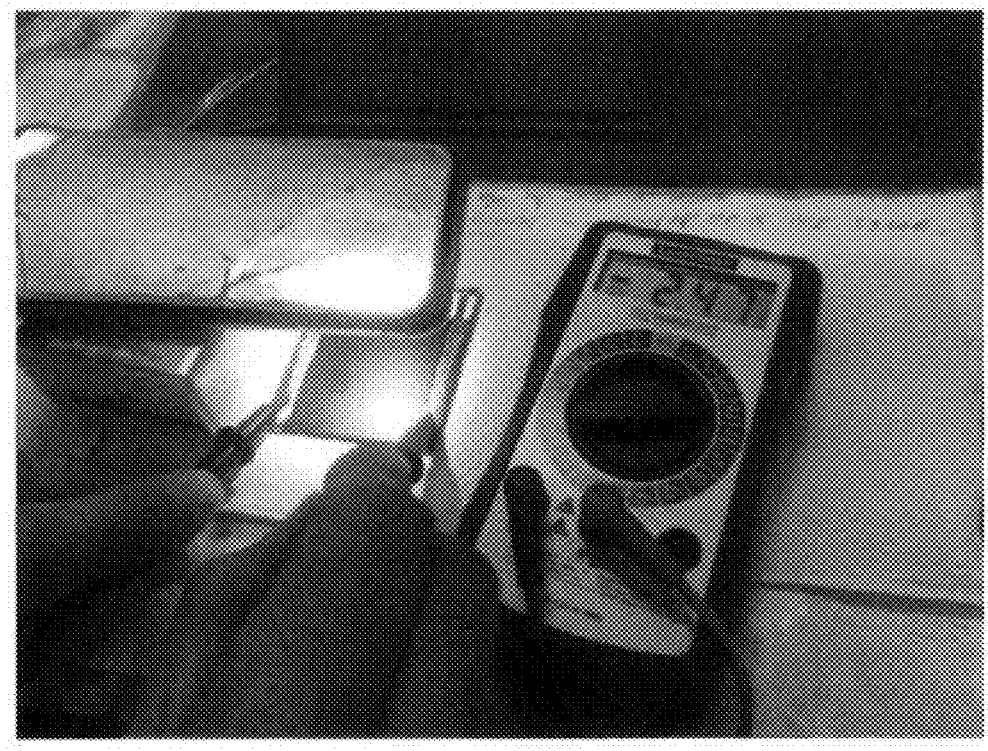
FIG. 3 shows a demonstrative diagram of measurement of the current on a circuit treated with $Na_2S$ for about 15 hours in the present invention.
Figure 4:
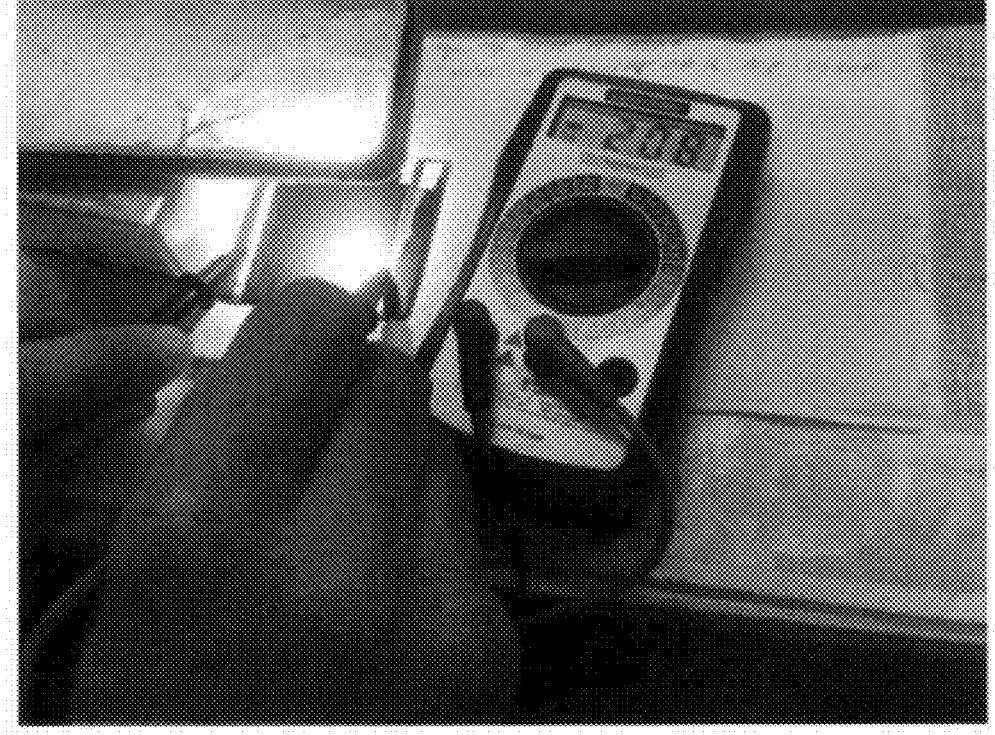
FIG. 4 shows a demonstrative diagram of measurement of the current on a circuit not treated with $Na_2S$ in the present invention.

Experimental evidences of the process function in the present invention are as follows:

As shown in FIG. 3, the electrical current on a circuit treated with $Na_2S$ for about 15 hours was measured, the measured current value was 2.47 mA, and the peak value in this measurement was 2.6 mA. As shown in FIG. 4, the current on a circuit not treated with $Na_2S$ (the adjacent portion of the circuit board used in FIG. 2) was measured under nearly identical illumination conditions, the measured momentary current value was 2.08 mA, and the peak value in this measurement was 2.5 mA.

Figure 5:
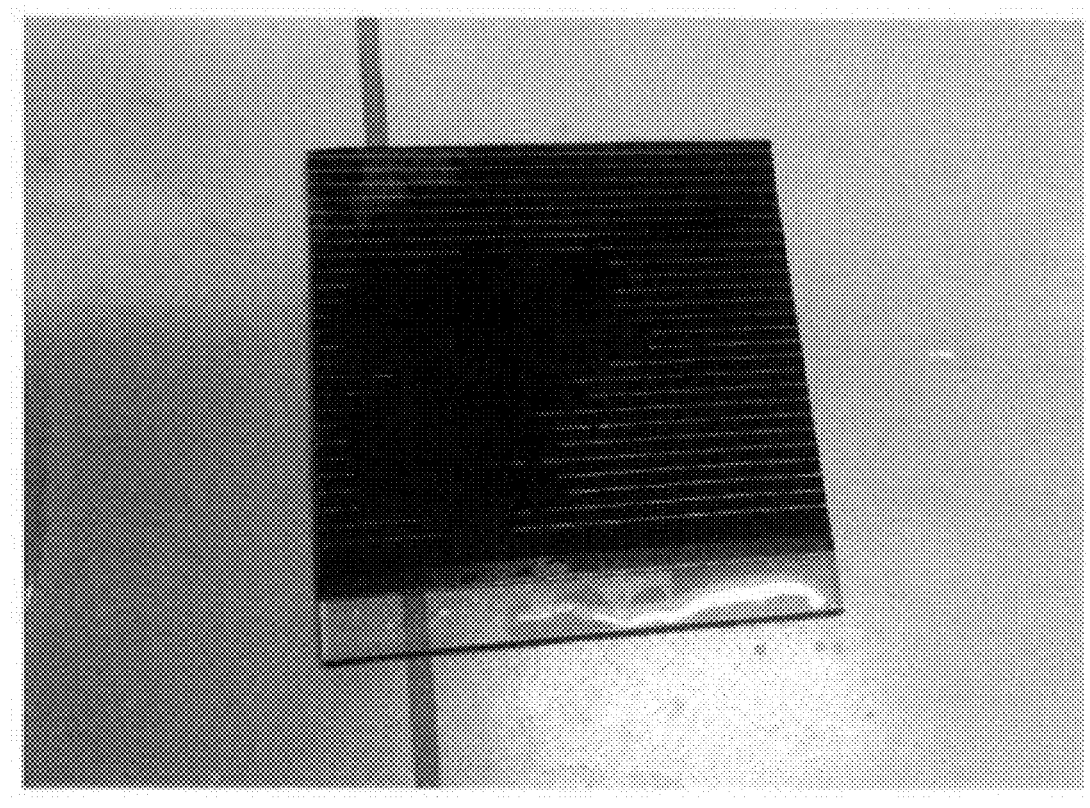
FIG. 5 shows a demonstrative diagram of a circuit (in a wet state) with silvery grid lines treated with $Na_2S$ in the present invention.

As shown in FIG. 5, a circuit with silver grid lines, after treatment with $Na_2S$, exhibits a decreased brightness of the grid lines in the sulfide-treated area (large dark spot on the left side). The circuit shown here is in a wet state, through which the overall brightness of the circuit and the grid lines is similar to the appearance in the laminated state.

Figure 6:
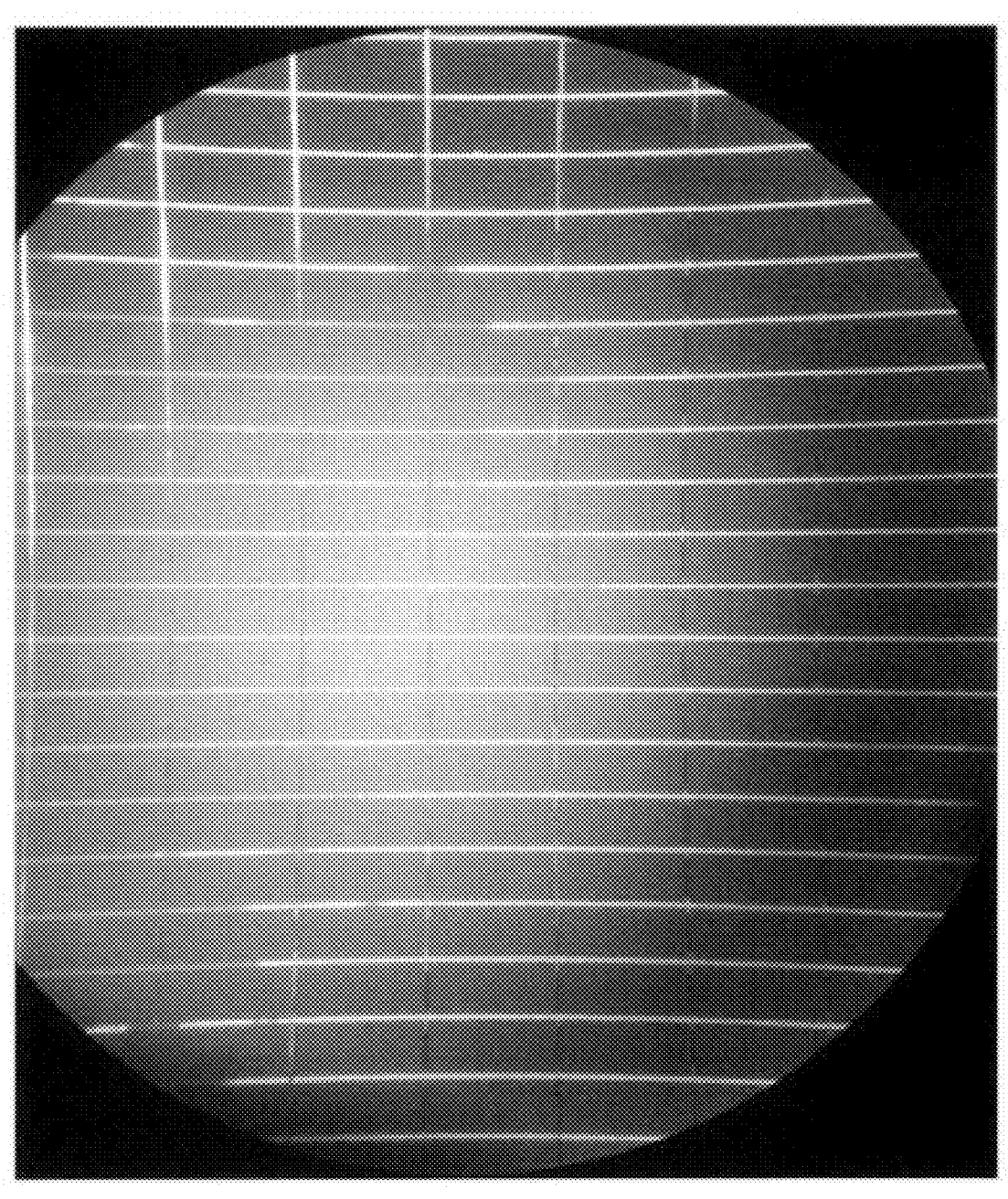
FIG. 6 shows a demonstrative diagram of a circuit (in a dry state) with the silvery grid lines treated with $Na_2S$ in the present invention.

As shown in FIG. 6, a circuit with silver grid lines treated with $Na_2S$ was observed in a dry state under a microscope (magnification: about 5×); the center of a treated region shown here is on the left side of the image (with darkened horizontal grid lines appearing grey), and circuit lines without silver sulfide layer (bright horizontal grid lines) are on the right, top and bottom areas of the image.

Figure 7:
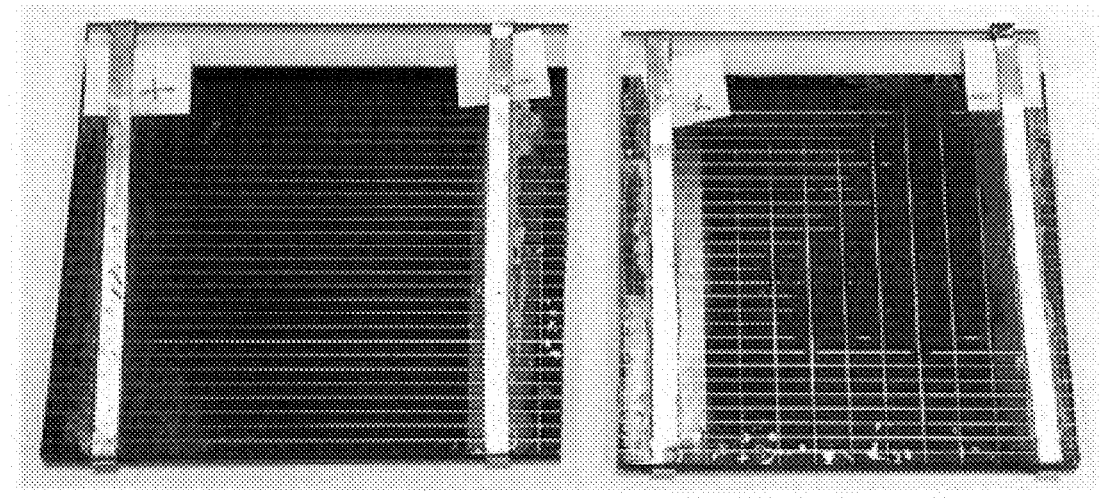
FIG. 7 shows a demonstrative diagram of the comparison between the untreated circuit (left) and the circuit treated with $Na_2S$ (right) in the present invention.

As shown in FIG. 7, the untreated circuit (left) was compared with the circuit treated with $Na_2S$ (right); due to the optical masking by the silver sulfide, the grid of the right treated circuit (the area in the upper right corner) does nearly not stand out from the surrounding absorber optically.

It can be known from the experimental results in FIGS. 3 to 7 that the silver sulfide coating formed by the surface reaction of the metal grid treated with $Na_2S$ plays the role of decreasing reflectivity of the thin-film photovoltaic module and increasing the photoelectric conversion efficiency of the thin-film photovoltaic module, and also decreases the brightness of photovoltaic circuits and modules with metal grids, improving the appearance.

What has been described above is merely preferred embodiments of the present invention rather than is intended to limit the present invention. Any modification, equivalent replacement, improvement and so on which are made within the spirit and principle of the present invention shall fall within the protection scope of the present invention.

What is claimed is:

1. A thin-film photovoltaic module, consisting of a glass substrate, a back contact layer, an absorber layer, a front electrode, a metal grid and a black silver sulfide coating, wherein the back contact layer, the absorber layer and the front electrode layer are sequentially stacked on the glass substrate, the metal grid is coated on a top surface of the front electrode layer without penetrating into the front electrode layer, the metal grid is made of a silver nanoparticle-containing paste, and a surface of the metal grid is covered by the black silver sulfide coating.

2. The thin-film photovoltaic module of claim 1, wherein an application method for the metal grid adopts any of screen printing, ink-jet printing and parallel extrusion dispersion.

3. A preparation method for the thin-film photovoltaic module of claim 1, comprising the following steps:

Step S1: creating a planar thin-film photovoltaic circuit;

Step S2: forming a metal grid by coating;

Step S3: curing or sintering the metal grid;

Step S4: making the metal grid contacted or exposed to a sulfide capable of generating sulfide ions, so that reaction takes place on the surface of the metal grid to form a black silver sulfide coating;

Step S5: removing residues outside the silver sulfide coating connected with the top layer of the metal grid, and performing washing and drying.

4. The preparation method of claim 3, wherein the form of the sulfide is any of water-soluble sulfide, gaseous hydrogen sulfide and organic sulfide.

5. The preparation method of claim 4, wherein the soluble sulfide is a hygroscopic alkali metal sulfide.

6. The preparation method of claim 5, wherein the hygroscopic alkali metal sulfide is powdery sodium sulphide.

7. The preparation method of claim 6, wherein the powdery sodium sulfide is applied to the metal grid in a manner that a concentrated aqueous sodium sulfide solution is formed by moisture content in the air and sodium sulfide through a treatment duration of at least one hour, and the aqueous solution reacts with silver on the surface of the metal grid to form a silver sulfide coating.

8. The preparation method of claim 6, wherein the powdery sodium sulfide is applied to the metal grid in another manner that an aqueous sodium sulfide solution is pre-prepared, and the aqueous solution carries out contact reaction with the metal grid by any of spraying, immersion, raking and impregnation to form a silver sulfide coating.

9. The preparation method 6, wherein the powdery sodium sulfide is pre-prepared into an aqueous sodium sulfide solution, and applied to the surface of the metal grid by heating, vacuum evaporation or vacuum deposition.

10. The preparation method of claim 4, wherein when the gaseous hydrogen sulfide is used, the metal grid is placed in an airtight chamber filled with the gaseous hydrogen sulfide, and the concentration and injection time of the gaseous hydrogen sulfide depend on the reaction speed of silver sulfide on the surface of the metal grid and the thickness or color of a desired silver sulfide coating.

11. The preparation method of claim 4, wherein the reaction between the silver on the surface of the metal grid and the organic sulfide varies due to aggregation states.

* * * * *